(12) United States Patent
Kim

(10) Patent No.: US 8,996,905 B2
(45) Date of Patent: Mar. 31, 2015

(54) PULSE GENERATION CIRCUIT, BURST ORDER CONTROL CIRCUIT, AND DATA OUTPUT CIRCUIT

(71) Applicant: SK Hynix Inc., Gyeonggi-do (KR)

(72) Inventor: Kwang-Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 320 days.

(21) Appl. No.: 13/714,343

(22) Filed: Dec. 13, 2012

(65) Prior Publication Data

US 2013/0162316 A1 Jun. 27, 2013

(30) Foreign Application Priority Data

Dec. 22, 2011 (KR) .......................... 10-2011-0140385

(51) Int. Cl.
*H03K 3/00* (2006.01)
*G11C 7/10* (2006.01)
*G11C 7/22* (2006.01)
*G11C 11/4076* (2006.01)
*G11C 11/4096* (2006.01)

(52) U.S. Cl.
CPC ................ *H03K 3/00* (2013.01); *G11C 7/1018* (2013.01); *G11C 7/1042* (2013.01); *G11C 7/1072* (2013.01); *G11C 7/222* (2013.01); *G11C 11/4076* (2013.01); *G11C 11/4096* (2013.01)
USPC ....................................................... 713/500

(58) Field of Classification Search
CPC ...... H03K 3/00; G11C 7/1018; G11C 7/1042; G11C 7/1072; G11C 7/222; G11C 11/4076; G11C 11/4096
See application file for complete search history.

(56) References Cited

U.S. PATENT DOCUMENTS

| | | | |
|---|---|---|---|
| 6,724,228 B2 * | 4/2004 | Kashiwazaki | 327/158 |
| 6,859,413 B2 * | 2/2005 | Phan et al. | 365/233.14 |
| 6,909,417 B2 * | 6/2005 | Washio et al. | 345/98 |
| 8,194,090 B2 * | 6/2012 | Sato | 345/545 |
| 8,842,061 B2 * | 9/2014 | Chen et al. | 345/92 |
| 2004/0008064 A1 * | 1/2004 | Kashiwazaki | 327/158 |

FOREIGN PATENT DOCUMENTS

| | | |
|---|---|---|
| KR | 1020030042213 | 5/2003 |
| KR | 1020100131198 | 12/2010 |

* cited by examiner

*Primary Examiner* — M Elamin
(74) *Attorney, Agent, or Firm* — IP & T Group LLP

(57) ABSTRACT

A pulse generation circuit includes a control unit configured to activate one or more of control clocks among a plurality of control clocks, and to activate one or more of select signals among a plurality of select signals, in response to one or more of sequence signals; a plurality of shifting units each configured to generate one or more of output signals, and to sequentially activate the one or more of output signals by shifting an input pulse when a corresponding control clock among the plurality of control clocks is activated; and a signal transfer unit configured to transfer one or more of output signals of a shifting unit corresponding to an activated select signal among the plurality of shifting units, as one or more of pulses.

13 Claims, 13 Drawing Sheets

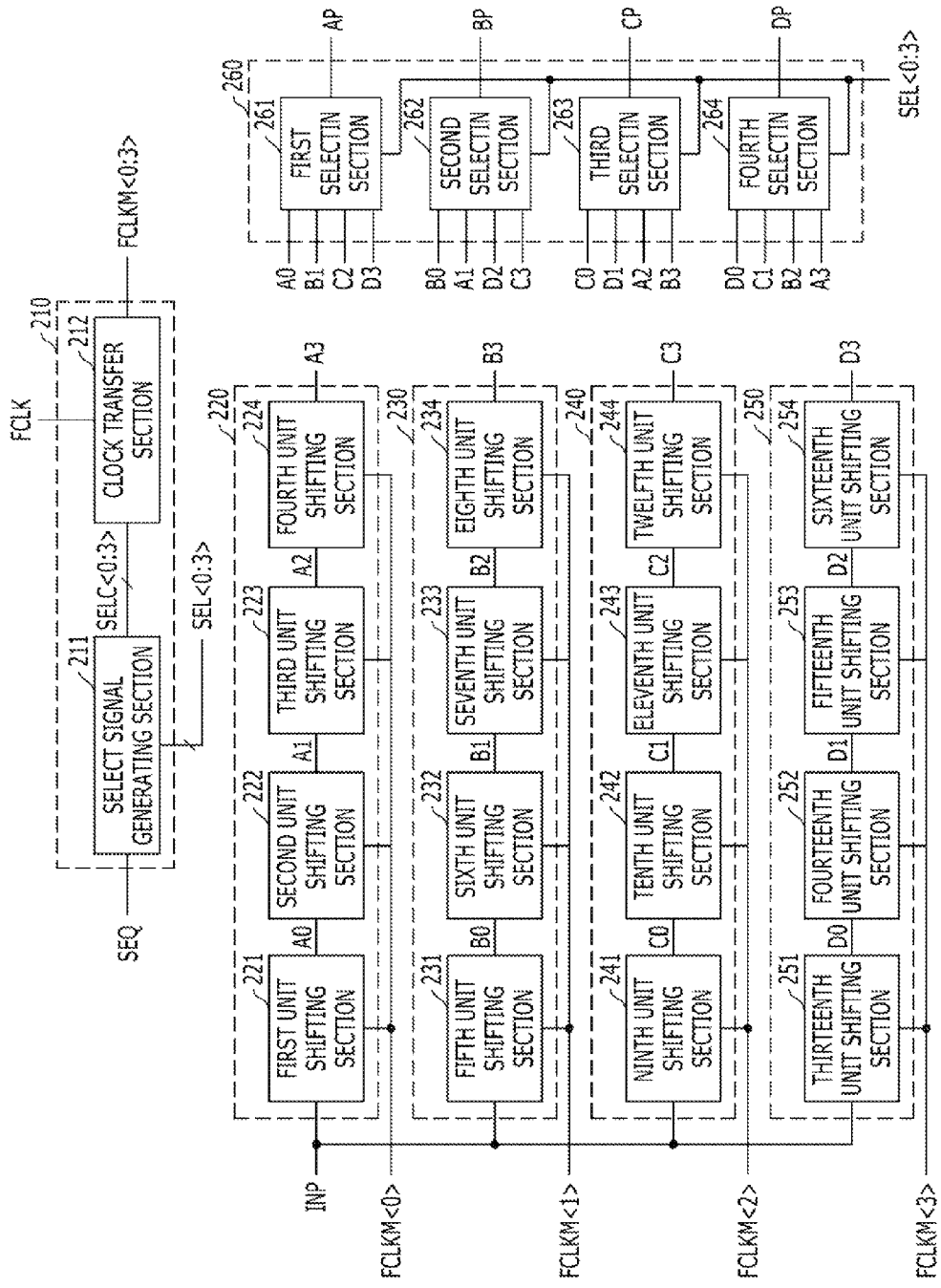

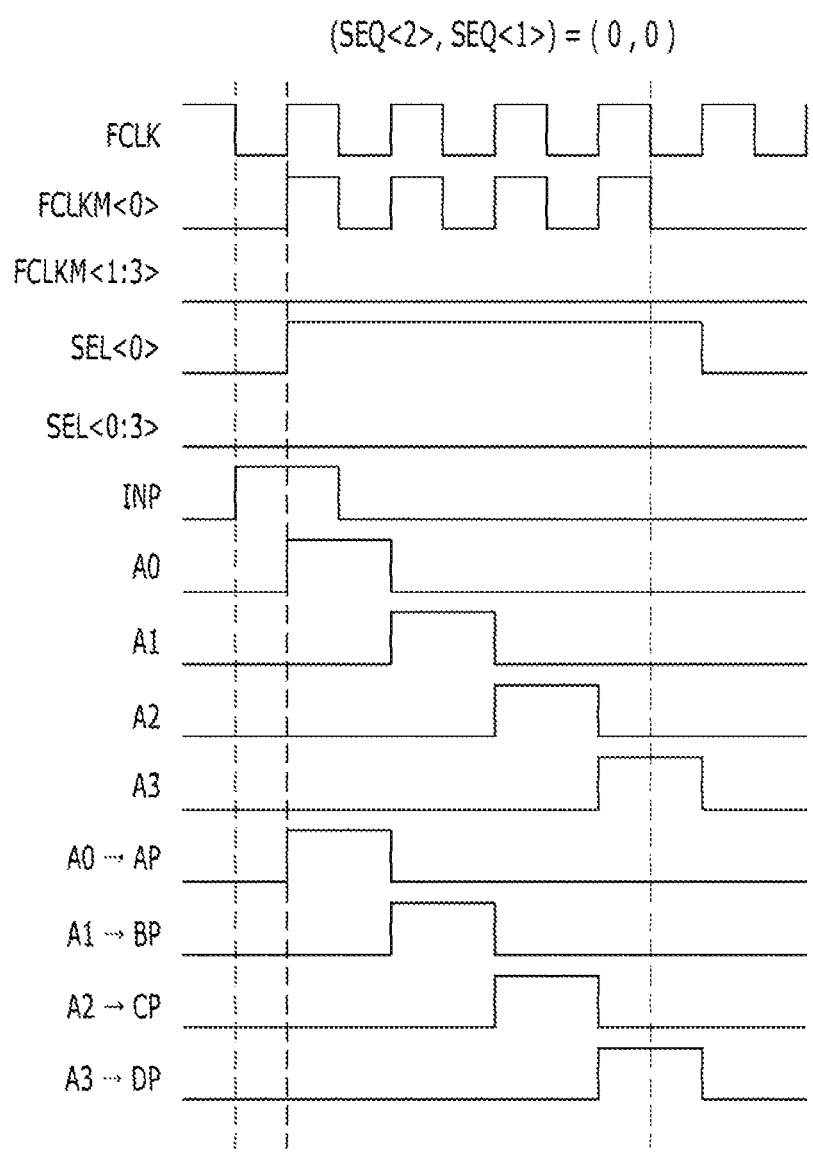

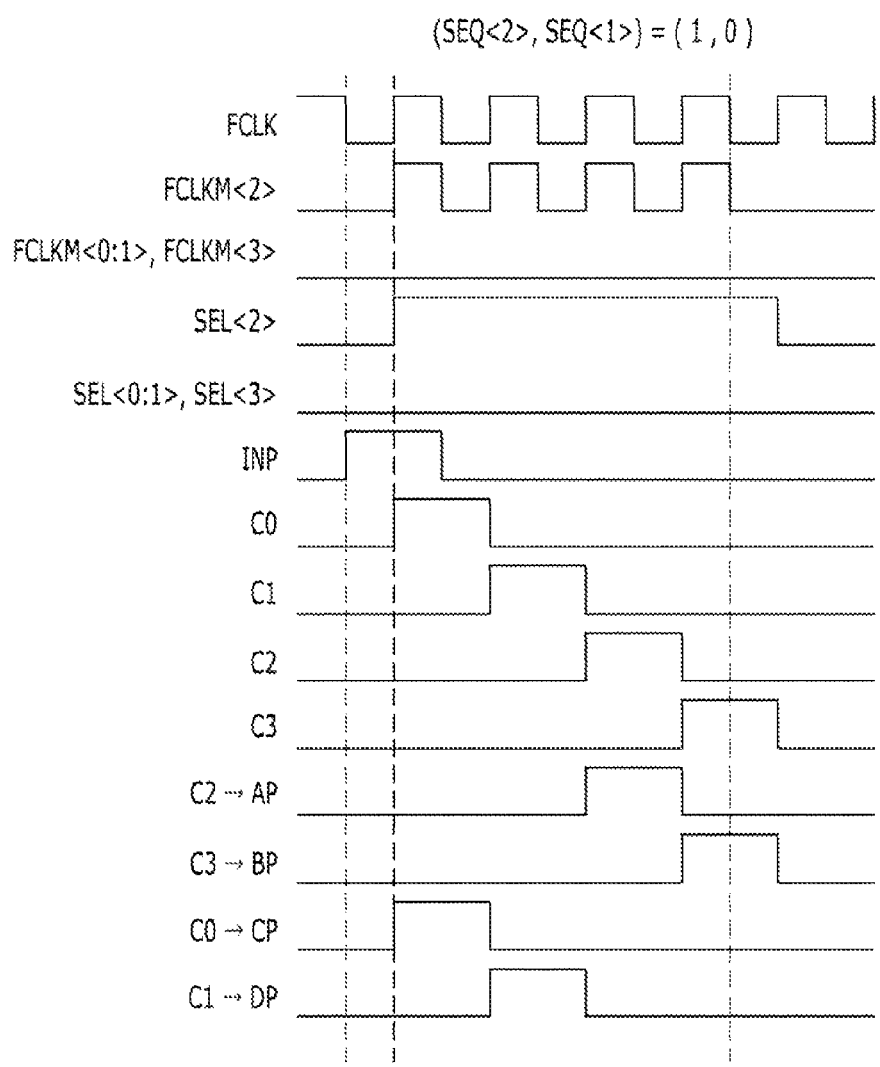

| SA<0> | SA<2> | SA<1> | SEQUENTIAL MODE | | | | INTERLEAVE MODE | | | |
|---|---|---|---|---|---|---|---|---|---|---|
| 0 | 0 | 0 | R<0> | R<1> | R<2> | R<3> | R<0> | R<1> | R<2> | R<3> |
| 1 | 0 | 0 | R<0> | R<1> | R<2> | R<3> | R<0> | R<1> | R<2> | R<3> |
| 0 | 0 | 1 | R<1> | R<0> | R<3> | R<2> | R<1> | R<0> | R<3> | R<2> |
| 1 | 0 | 1 | R<1> | R<0> | R<3> | R<2> | R<1> | R<0> | R<3> | R<2> |
| 0 | 1 | 0 | R<2> | R<3> | R<0> | R<1> | R<2> | R<3> | R<0> | R<1> |
| 1 | 1 | 0 | R<2> | R<3> | R<0> | R<1> | R<2> | R<3> | R<0> | R<1> |
| 0 | 1 | 1 | R<3> | R<2> | R<1> | R<0> | R<3> | R<2> | R<1> | R<0> |
| 1 | 1 | 1 | R<3> | R<2> | R<1> | R<0> | R<3> | R<2> | R<1> | R<0> |

C2

| SA<0> | SA<2> | SA<1> | SEQUENTIAL MODE | | | | INTERLEAVE MODE | | | |
|---|---|---|---|---|---|---|---|---|---|---|
| 0 | 0 | 0 | F<0> | F<1> | F<2> | F<3> | F<0> | F<1> | F<2> | F<3> |
| 1 | 0 | 0 | F<1> | F<0> | F<3> | F<2> | F<0> | F<1> | F<2> | F<3> |
| 0 | 0 | 1 | F<1> | F<0> | F<3> | F<2> | F<1> | F<0> | F<3> | F<2> |
| 1 | 0 | 1 | F<0> | F<1> | F<2> | F<3> | F<1> | F<0> | F<3> | F<2> |
| 0 | 1 | 0 | F<2> | F<3> | F<0> | F<1> | F<2> | F<3> | F<0> | F<1> |
| 1 | 1 | 0 | F<3> | F<2> | F<1> | F<0> | F<2> | F<3> | F<0> | F<1> |
| 0 | 1 | 1 | F<3> | F<2> | F<1> | F<0> | F<3> | F<2> | F<1> | F<0> |
| 1 | 1 | 1 | F<2> | F<3> | F<0> | F<1> | F<3> | F<2> | F<1> | F<0> |

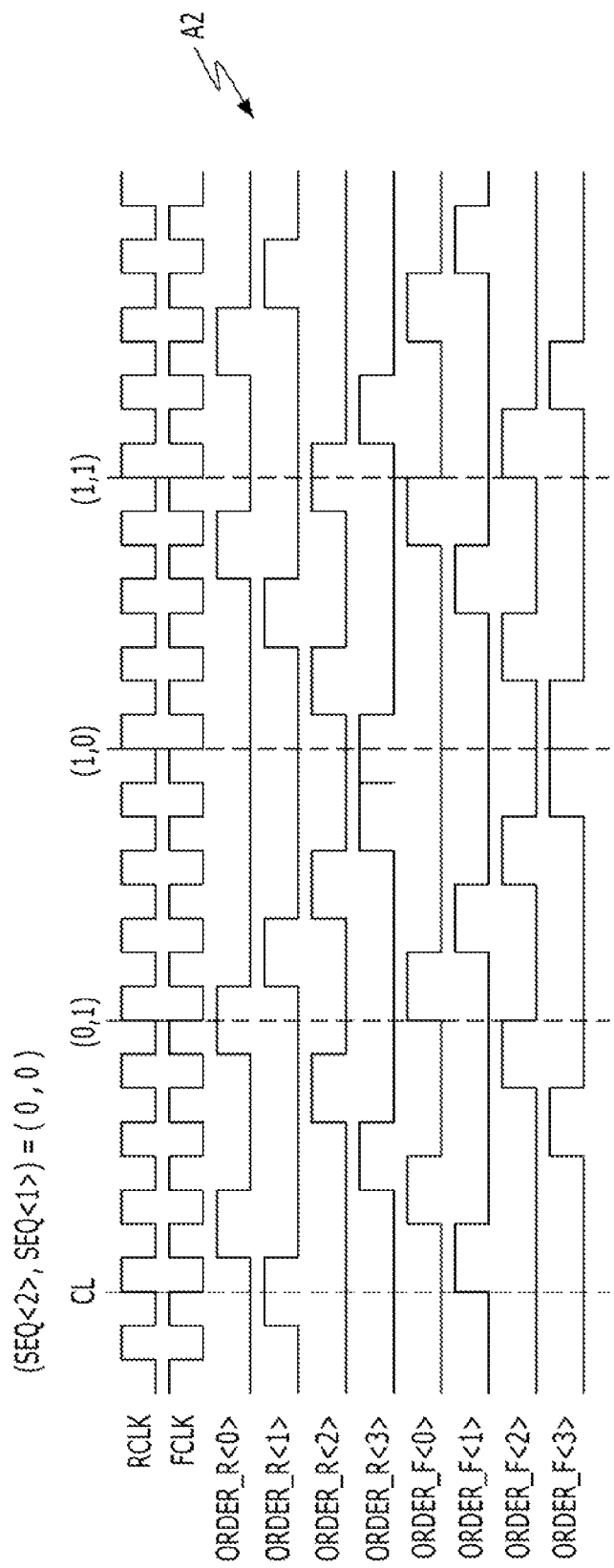

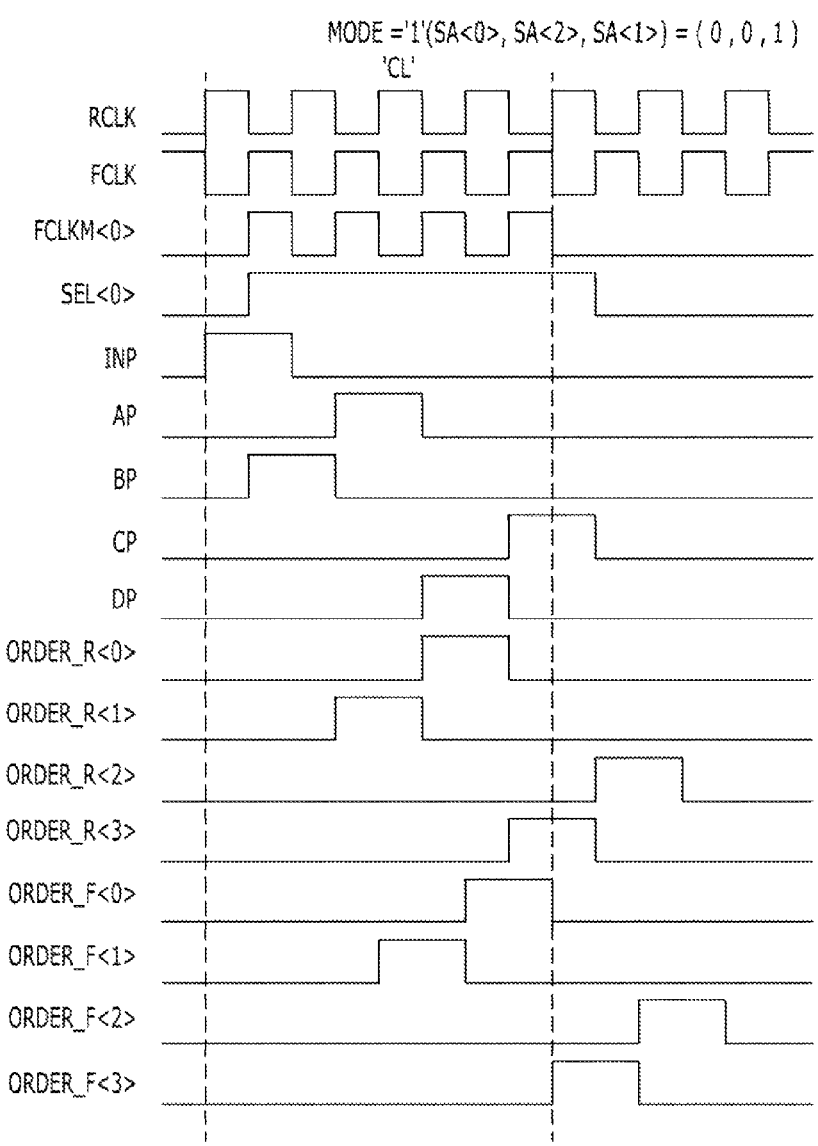

PULSE GENERATION CIRCUIT, BURST ORDER CONTROL CIRCUIT, AND DATA OUTPUT CIRCUIT

CROSS-REFERENCE TO RELATED APPLICATION

The present application claims priority of Korean Patent Application No. 10-2011-0140385, filed on Dec. 22, 2011, which is incorporated herein by reference in its entirety.

BACKGROUND

1. Field

Exemplary embodiments of the present invention relate to a pulse generation circuit, a burst order control circuit, and a data output circuit.

2. Description of the Related Art

Data input/output operations of a synchronous type semiconductor memory device are performed in synchronization with an internal clock, which is generated on the basis of an external clock. Kinds of such a synchronous type semiconductor memory device include an SDR (single data rate) SDRAM (synchronous dynamic random access memory), which outputs data only at the rising edge of a clock, a DDR (double data rate) SDRAM, which outputs data at the both of rising and falling edge of a clock, a DDR2 SDRAM, and a DDR3 SDRAM.

The DDR3 SDRAM generally adopts an 8-bit prefetch scheme. According to the 8-bit prefetch scheme, per read command, 8-bit data are outputted in parallel from a memory cell array, and then the 8-bit data are outputted in series through one data input/output pin to an outside during two clock cycles.

The device outputs the data in series with the controlled order according to a seed address and a burst mode, where burst order control controls the output order of data. The burst order control generates pulses respectively corresponding to a plurality of global lines such that the data, outputted to the plurality of global lines with the controlled order, and stored in pipe latches, are transferred to data lines of a next stage. For the burst order control, the pulses corresponding to the output lines of a plurality of latches are activated in the controlled order. With such burst order control, the data output circuit controls the order of data output.

A conventional data output circuit includes 24 D flip-flops and generates pulses for burst order control of 8 data by simultaneously operating the 24 D flip-flops. High power and current consumption are concerns related to the prior art, because many D flip-flops are simultaneously operated for the burst order control.

That is to say, in the conventional art, a problem may be caused in that, as the large number of D flip-flops are simultaneously activated to generate the plurality of pulse signals which are activated in the order that is specified according to the seed address and the burst mode, current and power consumption increases.

SUMMARY

Exemplary embodiments of the present invention are directed to a pulse generation circuit and a burst order control circuit, which may decrease the number of shifters simultaneously operating for the generation of a pulse, thereby reducing current and power consumption.

In accordance with an embodiment of the present invention, a pulse generation circuit may include a control unit configured to activate one or more of control clocks among a plurality of control clocks, and to activate one or more of select signals among a plurality of select signals, in response to one or more of sequence signals, a plurality of shifting units each configured to generate one or more of output signals, and to sequentially activate the one or of output signals by shifting an input pulse when a corresponding control clock among the plurality of control clocks is activated, and a signal transfer unit configured to transfer one or more of output signals of a shifting unit corresponding to an activated select signal among the plurality of shifting units, as one or more of pulses.

In accordance with another embodiment of the present invention, a data output circuit may include a plurality of data lines, an even control signal generation block including a plurality of shifting units each for generating one or more of output signals and for sequentially activating the one or more of output signals when designated by one or more of address signals, and configured to transfer the one or more of output signals of the shifting unit designated by the one or more of address signals, as one or more of even control signals, an odd control signal generation block configured to transfer the one or more of even control signals as one or more of odd control signals according to correspondence relationships determined by a mode signal and the one or more of address signals, and an output block configured to align and output data of the in plurality of data lines in response to the one or more of even control signals and the one or more of odd control signals.

In accordance with yet another embodiment of the present invention, a burst order control circuit may include an even control signal generation block including a plurality of shifting units each for generating one or more of output signals and for sequentially activating the one or more of output signals when designated by one or more of address signals, and configured to transfer the one or more of output signals of the shifting unit designated by the one or more of address signals, as one or more of even control signals, and an odd control signal generation block configured to transfer the one or more of even control signals as one or more of odd control signals according to correspondence relationships determined by a mode signal and the one or more of address signals.

In accordance with still another embodiment of the present invention, a pulse generation circuit may include a control unit configured to activate one of 1st and 2nd control clocks and to activate one of a 1st and 2nd select signals in response to a sequence signal, a 1st shifting unit configured to generate 1st and 2nd output signals and to sequentially activate the 1st and 2nd output signals by shifting an input pulse when the 1st control clock is activated, a 2nd shifting unit configured to generate 3rd and 4th output signals and to sequentially activate the 3rd and 4th output signals by shifting the input pulse when the 2nd control clock is activated, and a signal transfer unit configured to transfer the 1st and 2nd output signals as each of 1st and 2nd pulse in response to the 1st select signal, and to transfer the 3rd and 4th output signals as each the 1st and 2nd pulse in response to the 2nd select signal.

BRIEF DESCRIPTION OF THE DRAWINGS

FIG. 2 is a configuration diagram illustrating a pulse generation circuit in accordance with another embodiment of the present invention.

FIGS. 3A to 3D are waveform diagrams explaining operations of the pulse generation circuit shown in FIG. 2.

FIGS. 4A to 4D are diagrams explaining a burst order control operation according to an address and a burst mode.

FIGS. 6A and 6B are waveform diagrams explaining operations of a burst order controller including an even control signal generation block and an odd control signal generation block, corresponding to a burst order control circuit in accordance with another embodiment of the present invention, in the data output circuit shown in FIG. 5.

DETAILED DESCRIPTION

Figure 1:
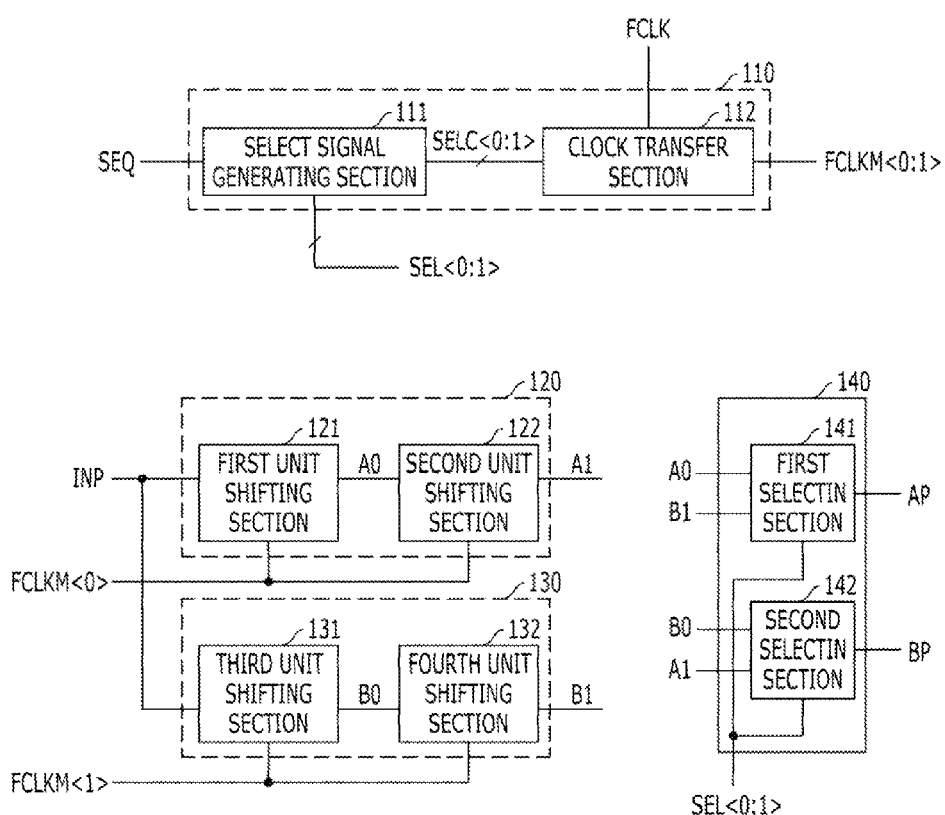
FIG. 1 is a configuration diagram illustrating a pulse generation circuit in accordance with an embodiment of the present invention.
Figure 3B:
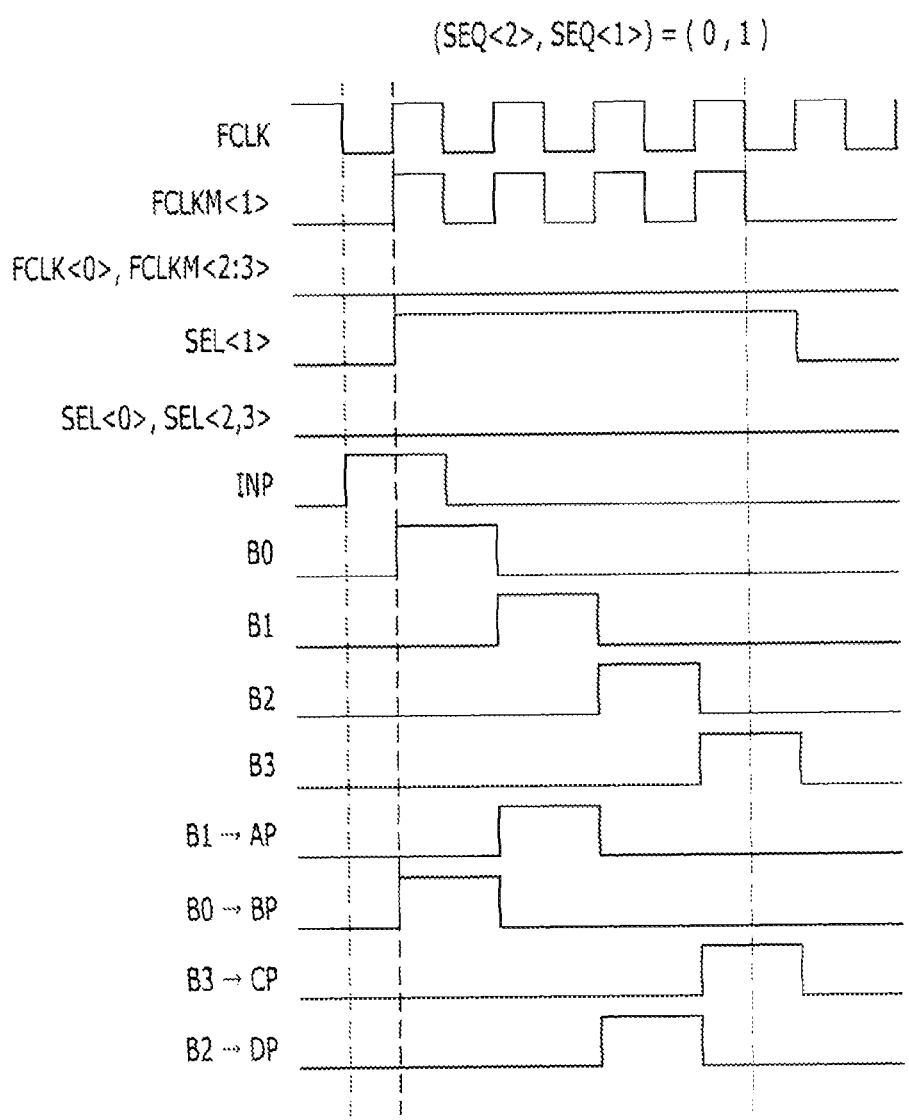
Figure 3D:
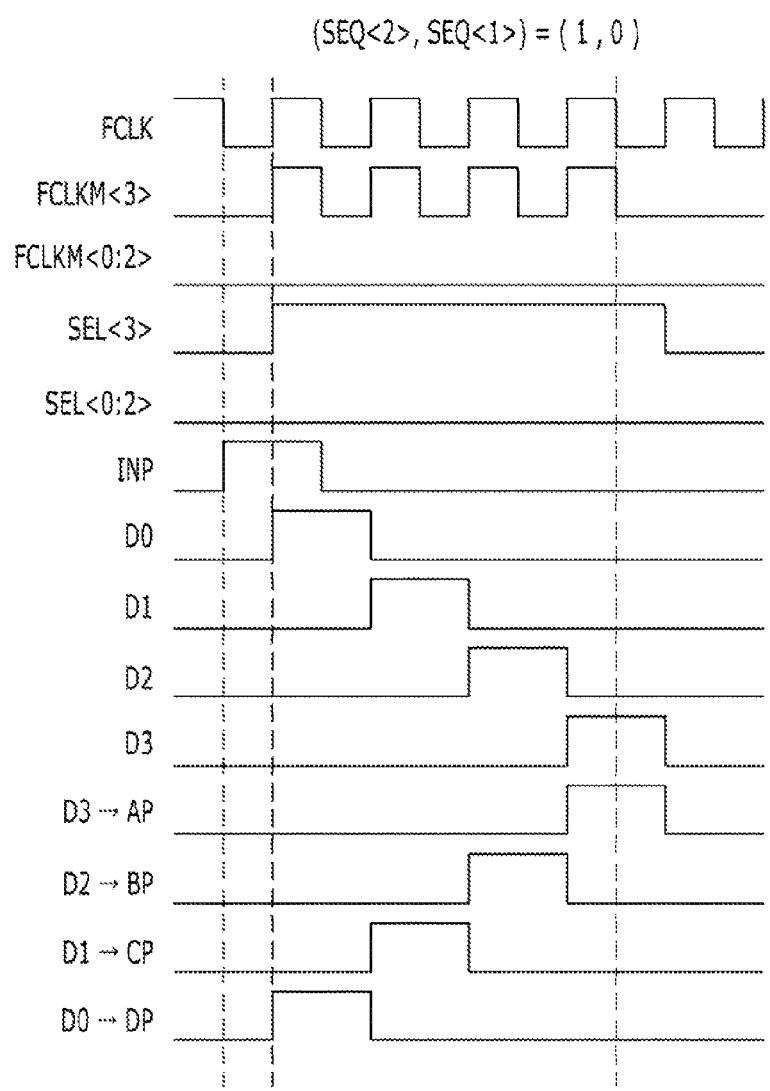

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a configuration diagram of a pulse generation circuit in accordance with an embodiment of the present invention. The pulse generation circuit of FIG. 1 generates a 1st pulse AP and a 2nd pulse BP, which are activated in the controlled order according to the value of a sequence signal SEQ.

Referring to FIG. 1, the pulse generation circuit includes a control unit 110, a 1st shifting unit 120, a 2nd shifting unit 130, and a signal transfer unit 140.

The control unit 110 activates one control clock of a 1st and 2nd control clocks FCLKM<0:1> and activates one select signal of a 1st select signals SEL<0:1> in response to a sequence signal SEQ.

The 1st shifting unit 120 generates and sequentially activates a 1st and 2nd output signals A0 and A1 by shifting an input pulse INP when the 1st control clock FCLKM<0> is activated.

The 2nd shifting unit 130 generates and sequentially activates a 3rd and 4th output signals B0 and B1 by shifting the input pulse INP when the 2nd control clock FCLKM<1> is activated.

The signal transfer unit 140 outputs in response to the 1st select signal SEL<0> the 1st and 2nd output signals A0 and A1 respectively as the 1st and 2nd pulses AP and B. The signal transfer unit 140 also outputs in response to the 2nd select signal SEL<1> the 3rd and 4th output signals B0 and B1 respectively as the 1st and 2nd pulses AP and BP.

The control unit 110 activates one control dock of the 1st and 2nd control clocks FCLKM<0:1> in response to the sequence signal SEQ, and activates one select signal of the 1st and 2nd select signals SEL<0:1> in response to the sequence signal SEQ. The sequence signal SEQ determines the activation order of the 1st and 2nd pulses AP and BP. For example, when the sequence signal SEQ is '0', the 1st pulse AP and then the 2nd pulse BP are activated in that order. When the sequence signal SEQ is '1', the 2nd pulse BP and then the 1st pulse AP are activated in that order. When the sequence signal SEQ is '0', the control unit 110 may activate the 1st control clock FCLKM<0> and the 1st select signal SEL<0>, and if the sequence signal SEQ is '1' the control unit 110 may activate the 2nd control clock FCLKM<1> and the 2nd select signal SEL<1>.

The control unit 110 includes a select signal generating section 111 and a clock transfer section 112. The select signal generating section 111 generates 1st and 2nd clock select signals SELC<0:1 and the 1st and 2nd select signals SEL<0:1> in response to the sequence signal SEQ. The select signal generating section 111 may activate the 1st select signal SEL<0> and the 1st clock select signal SELC<0> when the sequence signal SEQ is '0', and may activate the 2nd select signal SEL<1> and the 2nd clock select signal SELC<1> when the sequence signal SEQ is '1'.

The clock transfer section 112 transfer a source clock FCLK as the 1st control clock FCLKM<0> or the 2nd control clock FCLK<1> in response to the 1st and 2nd clock select signals SELC<0:1>. The clock transfer section 112 may transfer the source clock FCLK as the 1st control dock FCLKM<0> during the 1st clock select signal SELC<0> is activated, and may transfer the source clock FCLK as the 2nd control clock FCLKM<1> during the 2nd clock select signal SELC<1> is activated.

The 1st shifting unit 120 shifts the input pulse INP and sequentially activates the 1st and 2nd output signals A0 and A1 when the 1st control clock FCLKM<0> is activated, and deactivates the 1st and 2nd output signals A0 and A1 when the 1st control clock FCLKM<0> is deactivated. The 1st shifting unit 120 includes 1st and 2nd unit shifting sections 121 and 122, which are connected in series. The 1st and 2nd unit shifting sections 121 and 122 operate in synchronization with the activated 1st control clock FCLKM<0>, shift inputs thereto by a unit delay value (for example, 1 clock), and output resultant signals. The 1st and 2nd output signals A0 and A1 respectively correspond to the output of the 1st and 2nd unit shifting sections 121 and 122. Accordingly, if the 1st control clock FCLKM<0> is activated, the 1st and 2nd output signals A0 and A1 may be sequentially activated with the unit delay value (for example, 1 clock). The 1st and 2nd unit shifting sections 121 and 122 may include D flip-flops.

The 2nd shifting unit 130 shifts the input pulse INP and sequentially activates the 3rd and 4th output signals B0 and B1 when the 2nd control clock FCLKM<1> is activated, and deactivates the 3rd and 4th output signals B0 and B1 when the 2nd control clock FCLKM<1> is deactivated. The 2nd shifting unit 130 includes 3rd and 4th unit shifting sections 131 and 132, which are connected in series. The 3rd and 4th unit shifting sections 131 and 132 operate in synchronization with the activated 2nd control clock FCLKM<1>, shift inputs thereto by a unit delay value (for example, 1 clock), and output resultant signals. The 3rd and 4th output signals B0 and B1 respectively correspond to the output of the 3rd and 4th unit shifting sections 131 and 132. Accordingly, if the 2nd control clock FCLKM<1> is activated, the 3rd and 4th output signals B0 and B1 may be sequentially activated with the unit delay value (for example, 1 clock). The 3rd and 4th unit shifting sections 131 and 132 may include D flip-flops.

For reference, the output values of the 1st and 2nd unit shifting sections 121 and 122 may be reset to '0' during the 1st control clock FCLKM<0> is deactivated, and the output values of the 3rd and 4th unit shifting sections 131 and 132 may be reset to '0' during the 2nd control clock FCLKM<1> is deactivated.

The signal transfer unit 140 transfers the 1st and 2nd output signals A0 and A1 respectively as the 1st and 2nd pulses AP and BP when the 1st select signal SEL<0> is activated. Furthermore, the signal transfer unit 140 transfers the 3rd and 4th output signals B0 and B1 respectively as the 2nd and 1st pulses BP and AP when the 2nd select signal SEL<1> is activated. The signal transfer unit 140 includes 1st and 2nd selecting section 141 and 142. The 1st selecting section 141 transfers one of the 1st and 4th output signals A0 and B1 as the 1st pulse AP in response to the 1st and 2nd select signals SEL<0:1>. The 2nd selecting section 142 transfers one of the 2nd and 3rd output signals A1 and B0 as the 2nd pulse BP in response to the 1st and 2nd select signals SEL<0:1>.

If the 1st select signal SEL<0> is activated, the 1st selecting section 141 transfers the 1st output signal A0 as the 1st pulse AP, and the 2nd selecting section 142 transfers the 2nd output signal A1 as the 2nd pulse BP. If the 2nd select signal SEL<1> is activated, the 1st selecting section 141 transfers the 4th output signal B1 as the 1st pulse AP, and the 2nd selecting section 142 transfers the 3rd output signal B0 as the 2nd pulse BP.

Accordingly, when the 1st select signal SEL<0> is activated, the 1st and 2nd pulses AP and BP are activated respectively at the time of activation of the 1st and 2nd output signal A0 and A1. When the 2nd select signal SEL<1> is activated, 1st and 2nd pulses AP and BP are activated respectively at the time of activation of the 4th and 3rd output signals B1 and B0.

The pulse generation circuit in accordance with the embodiment of the present invention activates the 1st and 2nd pulses AP and BP in that order when the sequence signal SEQ is '0', and activates the 2nd and 1st pulses BP and AP in that order when the sequence signal SEQ is '1'. The pulse generation circuit activates only one shifting unit, and transfers the output signals generated by the activated shifting unit as the 1st and 2nd pulses AP and BP, thereby controlling the activation order of the 1st and 2nd pulses AP and BP. Therefore, since the control clock is supplied to only one shifting unit of the 1st and 2nd shifting units 120 and 130, current and power consumption may be reduced.

FIG. 2 is a configuration diagram of a pulse generation circuit in accordance with another embodiment of the present invention. The pulse generation circuit of FIG. 2 generates pulses AP to DP, which are activated in the controlled order according to the values of one or more of sequence signals SEQ<1:2>.

Referring to FIG. 2, the pulse generation circuit includes a control unit 210, a plurality of shifting units 220 to 250, and a signal transfer unit 260.

The control unit 210 activates one or more of control clocks among a plurality of control clocks FCLKM<0:3> and one or more of select signals among a plurality of select signals SEL<0:3> in response to the one or more of sequence signals SEQ<1:2>. The plurality of shifting units 220 to 250 each generates one or more of output signals and sequentially activate the one or more of output signals by shifting an input pulse INP when a corresponding control clock among the plurality of control clocks FCLKM<0:3> is activated. The signal transfer unit 260 transfers one or more of output signals of shifting units corresponding to the activated select signals among the plurality of shifting units 220 to 250, as one or more of pulses AP to DP.

The respective control clocks FCLKM<0:3> and the respective select signals SEL<0:3> correspond to the 1st to 4th shifting units 220 to 250.

The control unit 210 activates one control clock among the control clocks FCLKM<0:3>, and one select signal among the select signals SEL<0:3> in response to the sequence signals SEQ<1:2>. The sequence signals SEQ<1:2> determine the activation order of the pulses AP to DP.

The control unit 210 may activate the 1st control clock FCLKM<0> and the 1st select signal SEL<0> when the sequence signals SEQ<1:2> are (0, 0), the 2nd control clock FCLKM<1> and the 2nd select signal SEL<1> when the sequence signals SEQ 1:2> are (0, 1), the 3rd control clock FCLKM<2> and the 3rd select signal SEL<2> when the sequence signals SEQ<1:2> are (1, 0), and the 4th control clock FCLKM<3> and the 4th select signal SEL<3> when the sequence signals SEQ<1:2> are (1, 1).

The control unit 210 includes a select signal generating section 211 and a clock transfer section 212. The select signal generating section 211 generates clock select signals SELC<0:3> and the select signals SEL<0:3> in response to the sequence signals SEQ<1:2>. The clock transfer section 212 transfers a source clock FCLK as one of the control docks FCLKM<0:3> in response to the dock select signals SELC<0:3>.

The select signal generating section 211 may activate the 1st clock select signal SELC<0> and the 1st select signal SEL<0> when the sequence signals SEQ<1:2> are (0, 0); the 2nd clock select signal SELC<1> and the 2nd select signal SEL<1> when the sequence signals SEQ<1:2> are (0, 1); the 3rd clock select signal SELC<2> and the 3rd select signal SEL<2> when the sequence signals SEQ<1:2> are (1, 0); and the 4th clock select signal SELC<3> and the 4th select signal SEL<3> when the sequence signals SEQ<1:2> are (1, 1).

The clock transfer section 212 may transfer the source clock FCLK as the 1st control clock FCLKM<0> during the 1st clock select signal SELC<0> is activated; as the 2nd control clock FCLKM<1> during the 2nd clock select signal SELC<1> is activated; as the 3rd control clock FCLKM<2> during the 3rd clock select signal SELC<2> is activated; and as the 4th control clock FCLKM<3> during the 4th clock select signal SELC 3> is activated.

The 1st shifting unit 220 shifts the input pulse INP and sequentially activates the output signals A0 to A3 when the 1st control clock FCLKM<0> is activated, and deactivates the output signals A0 to A3 when the 1st control clock FCLKM<0> is deactivated. The 1st shifting unit 220 includes shifting sections 221 to 224, which are connected in series. The shifting sections 221 to 224 operate in synchronization with the activated 1st control clock FCLK<0>, shift inputs thereto by a unit delay value (for example, one clock), and output resultant signals. Here, the output signals A0 to A3 respectively correspond to the outputs of the shifting sections 221 to 224. Accordingly, if the 1st control clock FCLKM<0> is activated, the output signals A0 to A3 may be sequentially activated with an interval of one clock (the unit delay value). The shifting sections 221 to 224 may include D flip-flops.

The 2nd shifting unit 230 includes 5th to 8th unit shifting sections 231 to 234, and shifts the input pulse INP and sequentially activates the 5th to 8th output signals B0 to B3 when the 2nd control clock FCLKM<1> is activated. The 3rd shifting unit 240 includes 9th to 12th unit shifting sections 241 to 244, and shifts the input pulse INP and sequentially activates the ninth to twelfth output signals C0 to C3 when the 3rd control clock FCLKM<2> is activated. The 4th shifting unit 250 includes thirteenth to 16th unit shifting sections 251 to 254, and shifts the input pulse INP and sequentially activates the 13th to 16th output signals D0 to D3 when the 4th control clock FCLKM<3> is activated. The detailed configurations and operations of the shifting units 230 to 250 are substantially the same as the 1st shifting unit 220.

For reference, the output values of the shifting sections 221 to 224 may be reset to '0' during the 1st control clock FCLKM<0> is deactivated; the output values of the unit shifting sections 231 to 234 may be reset to '0' during the 2nd control clock FCLKM<1> is deactivated; the output values of the unit shifting sections 241 to 244 may be reset to '0' during the 3rd control dock FCLKM<2> is deactivated; and the output values of the unit shifting sections 251 to 254 may be reset to '0' during the 4th control clock FCLKM<3> is deactivated.

The signal transfer unit 260 transfers the output signals A0 to A3 respectively as the pulses AP to DP when the 1st select signal SEL<0> is activated; output signals B0 to B3 when the 2nd select signal SEL<1> is activated; output signals C0 to C3 when the 3rd select signal SEL<2> is activated; and output signals D0 to D3 when the 4th select signal SEL<3> is activated.

The signal transfer unit 260 includes selecting sections 261 to 264. The 1st selecting section 261 selects one of the 1st output signal A0, the 6th output signal 61, the 11th output signal C2 and the 16th output signal D3 in response to the activated one among the select signals SEL<0:3> and output the selected signal as the 1st pulse AP. The 2nd selecting section 262 selects one of the 2nd output signal A1, the 5th output signal B0, the 12th output signal C3 and the 15th output signal D2 in response to activated one among the select signals SEL<0:3> and output the selected signal as the 2nd pulse BP. The 3rd selecting section 263 selects one of the 3rd output signal A2, the 8th output signal B3, the 9th output signal C0 and the 14th output signal D1 in response to activated one among the select signals SEL<0:3> and output the selected signal as the 3rd pulse CP. The 4th selecting section 264 selects one of the 4th output signal A3, the 7th output signal B2, the 10th output signal C1 and the 13th output signal D0 in response to activated one among the select signals SEL<0:3> and output the selected signal as the 4th pulse DP.

When the 1st select signal SEL<0> is activated, the 1st selecting section 261 transfers the 1st output signal A0 as the 1st pulse AP, the 2nd selecting section 262 transfers the 2nd output signal A1 as the 2nd pulse BP, the 3rd selecting section 263 transfers the 3rd output signal A2 as the 3rd pulse CP, and the 4th selecting section 264 transfers the 4th output signal A3 as the 4th pulse DP.

When the 2nd select signal SEL<1> is activated, the 1st selecting section 261 transfers the 6th output signal B1 as the 1st pulse AP, the 2nd selecting section 262 transfers the 5th output signal B0 as the 2nd pulse BP, the 3rd selecting section 263 transfers the 8th output signal B3 as the 3rd pulse CP, and the 4th selecting section 264 transfers the 7th output signal B2 as the 4th pulse DP.

When the 3rd select signal SEL<2> is activated, the 1st selecting section 261 transfers the 11th output signal C2 as the 1st pulse AP, the 2nd selecting section 262 transfers the 12th output signal C3 as the 2nd pulse BP, the 3rd selecting section 263 transfers the 9th output signal C0 as the 3rd pulse CP, and the 4th selecting section 264 transfers the 10th output signal C1 as the 4th pulse DP.

When the 4th select signal SEL<3> is activated, the 1st selecting section 261 transfers the 16th output signal D3 as the 1st pulse AP, the 2nd selecting section 262 transfers the 15th output signal D2 as the 2nd pulse BP, the 3rd selecting section 263 transfers the 14th output signal D1 as the 3rd pulse CP, and the 4th selecting section 264 transfers the 13th output signal D0 as the 4th pulse DP.

In the case where the 1st select signal SEL<0> is activated, the pulses AP to DP are activated respectively at the respective activation times of the output signals A0, A1, A2 and A3. In the case where the 2nd select signal SEL<1> is activated, the pulses AP to DP are activated respectively at the respective activation times of the output signals 61, B0, B3 and B2. In the case where the 3rd select signal SEL<2> is activated, the pulses AP to DP are activated respectively at the respective activation times of the output signals C2, C3, C0 and C1, In the case where the 4th select signal SEL<3> is activated, the pulses AP to DP are activated respectively at the respective activation times of the output signals D3, D2, D1 and D0.

The pulse generation circuit in accordance with the present embodiment activates the pulses AP, BP, CP, and DP in that order when the sequence signals SEQ<1:2> are (0, 0). BP, AP, DP and CP in that order when the sequence signals SEQ<1:2> are (0, 1); CP, DP, AP and BP in that order when the sequence signals SEQ<1:2> are (1, 0); and DP, CP, BP and AP in that order when the sequence signal's SEQ<1:2> are (1, 1).

That is to say, the pulse generation circuit in accordance with the present embodiment activates the pulses AP to DP in the controlled order according to the values of the sequence signals SEQ<1:2>. The pulse generation circuit activates only one shifting unit selected by the sequence signals SEQ<1:2> and transfers the output signals generated by an activated shifting unit to the pulses AP to DP with controlled order, thereby controlling the activation order of the AP to DP. Hence, since a control clock is supplied to only one shifting unit among the 1st to 4th shifting units 220 to 250 at a time, current and power consumption may be reduced.

While pulse generation circuits for generating two and four pulses, respectively, are shown in FIGS. 1 and 2, the number of pulses to be generated and the order in which the pulses are to be activated according to an order signal may vary according to a design.

FIGS. 3A to 3D are waveform diagrams explaining operations of the pulse generation circuit shown in FIG. 2. In FIGS. 3A to 3D, the operations of the pulse generation circuit will be described in the case where the sequence signals SEQ<1:2> are inputted in the order of (0, 0), (0, 1), (1, 0) and (1, 1). The 1st to 16th output signals A0 to A3, B0 to B3, C0 to C3 and D0 to D3 are activated by shifting the input pulse INP.

In the case where the sequence signals SEQ<1:2> are (0, 0) (that is, FIG. 3A), the 1st control clock FCLKM<0> and the 1st select signal SEL<0> are activated, and the output signals A0 to A3 are sequentially activated by the 1st shifting unit 220 and are then transferred as the pulses AP to DP as described above with reference to FIG. 2. Thus, the 1st pulse AP, the 2nd pulse BP, the 3rd pulse CP and the 4th pulse DP are activated in that order.

In the case where the sequence signals SEQ<1:2> are (0, 1) (that is, FIG. 3B), the 2nd control clock FCLKM<1> and the 2nd select signal SEL<1> are activated, and the 5th to 8th output signals B0 to B3 are sequentially activated by the 2nd shifting unit 230 and are then transferred as the pulses AP to DP as described above with reference to FIG. 2. Thus, the 2nd pulse BP, the 1st pulse AP, the 4th pulse DP and the 3rd pulse CP are activated in that order.

In the case where the sequence signals SEQ<1:2> are (1, 0) (that is, FIG. 3C), the 3rd control clock FCLKM<2> and the 3rd select signal SEL<2> are activated, and the 9th to 12th output signals C0 to C3 are sequentially activated by the 3rd shifting unit 240 and are then transferred as the pulses AP to DP as described above with reference to FIG. 2. Thus, the 3rd pulse CP, the 4th pulse DP, the 1st pulse AP and the 2nd pulse BP are activated in that order.

In the case where the sequence signals SEQ<1:2> are 1, 1) (that is, FIG. 3D), the 4th control clock FCLKM<3> and the 4th select signal SEL<3> are activated, and the 13th to 16th output signals D0 to D3 are sequentially activated by the 4th shifting unit 250 and are then transferred as the pulses AP to DP as described above with reference to FIG. 2. Thus, the 4th pulse DP, the 3rd pulse CP, the 2nd pulse BP and the 1st pulse AP are activated in that order.

FIGS. 4A to 4D are diagrams explaining a burst order control operation according to an address and a burst mode.

Figure 4A:
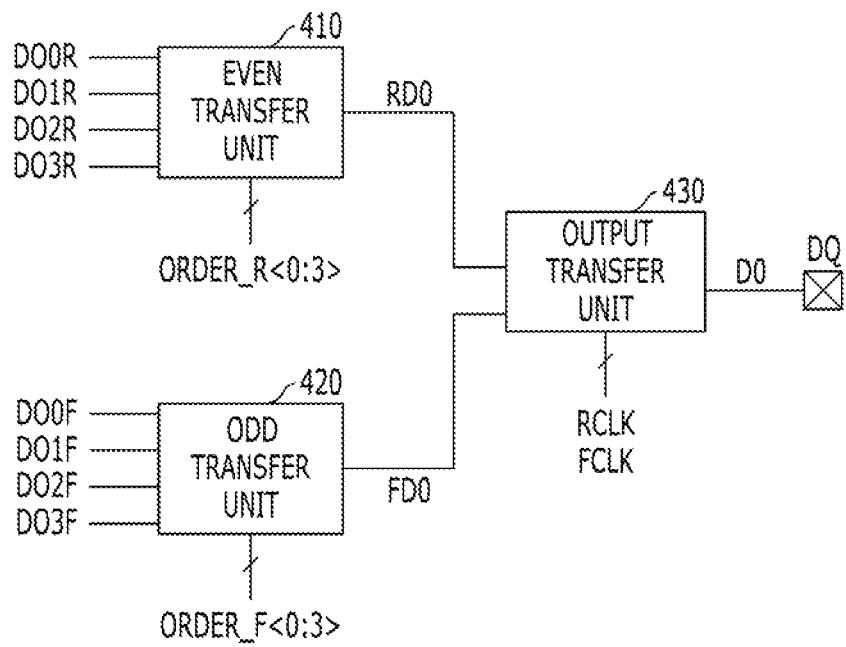

FIG. 4A is a configuration diagram of a data output block. The data output block outputs to a data input/output pad DQ the sequentially aligned data transferred through a plurality of global lines (not shown) in response to even control signals ORDER_R<0:3> and odd control signals ORDER_F<0:3> generated by a burst order control circuit (not shown) according to seed addresses SA<0:2> and a burst mode.

The data output block includes a plurality of lines DO0R to DO3R, DO0F to DO3F, RDO, FDO and DO, an even transfer unit 410, an odd transfer unit 420, and an output transfer unit 430. The plurality of lines DO0R to DO3R, DO0F to DO3F, RDO, FDO and DO transfer to the data input/output pad DQ the data transferred through the plurality of global lines, stored in a plurality of pipe latches (not shown) and then outputted. The even transfer unit 410 transfers to the even transfer line RDO the data of an even data line corresponding to an activated even control signal among the 1st to 4th even data lines DO0R to DO3R. The odd transfer unit 420 transfers to the odd transfer line FDO the data of an odd data line corresponding to an activated odd control signal among the 1st to 4th odd data lines DO0F to DO3F. The output transfer unit 430 transfers the data of the even transfer line RDO to the output line DO in response to a rising clock RCLK and transfers the data of the odd transfer line FDO to the output line DO in response to a falling clock FCLK.

The even transfer unit 410 transfers the data of the 1st even data line DO0R to the even transfer line RDO when the 1st even control signal ORDER_R<0> is activated; the data of the 2nd even data line DO1R to the even transfer line RDO when the 2nd even control signal ORDER_R<1> is activated; the data of the 3rd even data line DO2R to the even transfer line RDO when the 3rd even control signal ORDER_R<2> is activated; the data of the 4th even data line DQ3R to the even transfer line RDO when the 4th even control signal ORDER_R<3> is activated.

The odd transfer unit 420 transfers the data of the 1st odd data line DO0F to the odd transfer line FDO when the 1st odd control signal ORDER_F<0> is activated; the data of the 2nd odd data line DO1F to the odd transfer line FDO when the 2nd odd control signal ORDER_F<1> is activated; the data of the 3rd odd data line DO2F to the odd transfer line FDO when the 3rd odd control signal ORDER_F<2> is activated; and the data of the 4th odd data line DO3F to the odd transfer line FDO when the 4th odd control signal ORDER_F<3> is activated.

The output transfer unit 430 transfers the data of the even transfer line RDO to the output line DO at the rising edge of the rising clock RCLK, and transfers the data of the odd transfer line FDO to the output line DO at the rising edge of the falling clock FCLK. The data transferred to the output line D is outputted to an outside of a semiconductor memory device through the data input/output pad DQ.

FIG. 43 is a drawing explaining the waveforms of the even control signals ORDER_R<0:3> and the odd control signal's ORDER_F<0:3> according to the addresses SA<0:2> and the burst mode.

A 1st table C1 shows the activation orders of the even control signals ORDER_R<0:3> according to the addresses SA<0:2> and the burst mode. Here, R<0>, R<1>, R<2> and R<3> respectively correspond to the 1st to 4th even control signals ORDER_R<0:3>.

Referring to the 1st table C1, when both the 2nd and 3rd addresses SA<1> and SA<2> are '0', R<0>, R<1>, R<2> and R<3> are activated in that order regardless of the 1st address SA<0> and the burst mode. When the 2nd address SA<1> is '1' and the 3rd address SA<2> is '0', R<1>, R<0>, R<3> and R<2> are activated in that order regardless of the 1st address SA<0> and the burst mode. When the 2nd address SA<1> is '0' and the 3rd address SA<2> is '1', R<2>, R<3>, R<0> and R<1> are activated in that order regardless of the 1st address SA<0> and the burst mode. When both the 2nd and 3rd addresses SA<1> and SA<2> are '1' R<3>, R<2>, R<1> and R<0> are activated in that order regardless of the 1st address SA<0> and the burst mode.

A 2nd table C2 shows the activation orders of the odd control signals ORDER_F<0:3> according to the addresses SA<0:2> and the burst mode. Here, F<0>, F<1>, F<2>, and F<3> respectively correspond to the 1st to 4th odd control signals ORDER_F<0:3>.

The situation is that both the 2nd and 3rd addresses SA<1> and SA<2> are '0'. In a sequential mode, F<0>, F<1>, F<2> and F<3> are activated in that order when the 1st address SA<0> is '0'; and F<1>, F<0>, F<3> and F<2> are activated in that order when the 1st address SA<0> is '1'. In an interleave mode, F<0>, F<1>, F<2> and F<3> are activated in that order regardless of the 1st address SA<0>.

The situation is that the 2nd address SA<1> is '1' and the 3rd address SA<2> is '0'. In the sequential mode, F<1>, F<0>, F<3> and F<2> are activated in that order when the 1st address SA<0> is '0'; and F<0>, F<1>, F<2> and F<3> are activated in that order when the 1st address SA<0> is '1'. In the interleave mode, F<1>, F<0>, F<3> and F<2> are activated in that order regardless of the 1st address SA<0>.

The situation is that the 2nd address SA 1> is '0' and the 3rd address SA<2> is '1'. In the sequential mode, F<2>, F<3>, F<0> and F<1> are activated in that order when the 1st address SA<0> is '0'; and F<3>, F<2>, F<1> and F<0> are activated in that order when the 1st address SA<0> is '1'. In the interleave mode, F<2>, F<3>, F<0> and F<1> are activated in that order regardless of the 1st address SA<0>.

The situation is that both the 2nd and 3rd address SA<1> and SA<2> are '1'. In the sequential mode, F<3>, F<2>, F<1> and F<0> are activated in that order when the 1st address SA 0> is '0'; and F<2>, F<3>, F<0> and F<1> are activated in that order when the 1st address SA<0> is '1'. In the interleave mode, F<3>, F<2>, F<1> and F<0> are activated in that order regardless of the 1st address SA<0>.

As described above, in the sequential mode, the activation order of the even control signals ORDER_R<0:3> and the odd control signals ORDER_F<0:3> according to the 2nd and 3rd addresses SA<1> and SA<2> are the same with each other except when the 1st address SA<0> is '1'. Therefore, the odd control signals ORDER_F<0:3> may be generated by delaying the even control signals ORDER_R<0:3> by one-half clock (0.5 clock). In the sequential mode, in the case where the 1st address SA<0> is '1', the odd control signals ORDER_F<0:3> may be generated by delaying the even control signals ORDER_R<0:3> by one-half clock, and by transferring the 1st even control signal ORDER_R<0> as the 2nd odd control signal ORDER_F<1>; the 2nd even control signal ORDER_R<1> as the 1st odd control signal ORDER_F 0 the 3rd even control signal ORDER_R<2> as the 4th odd control signal ORDER_F<3>; and the 4th even control signal ORDER_R<3> as the 3rd odd control signal ORDER_F<2>.

The activation order of the even control signals ORDER_R<0:3> is same as the transfer order of the data from the 1st to 4th even data lines DO0R to DO3R to the even transfer line RDO. The activation order of the odd control signals ORDER_F<0:3> is same as the transfer order of the data from the 1st to 4th odd data lines DO0F to DO3F to the odd transfer line FDO.

Figure 4C:
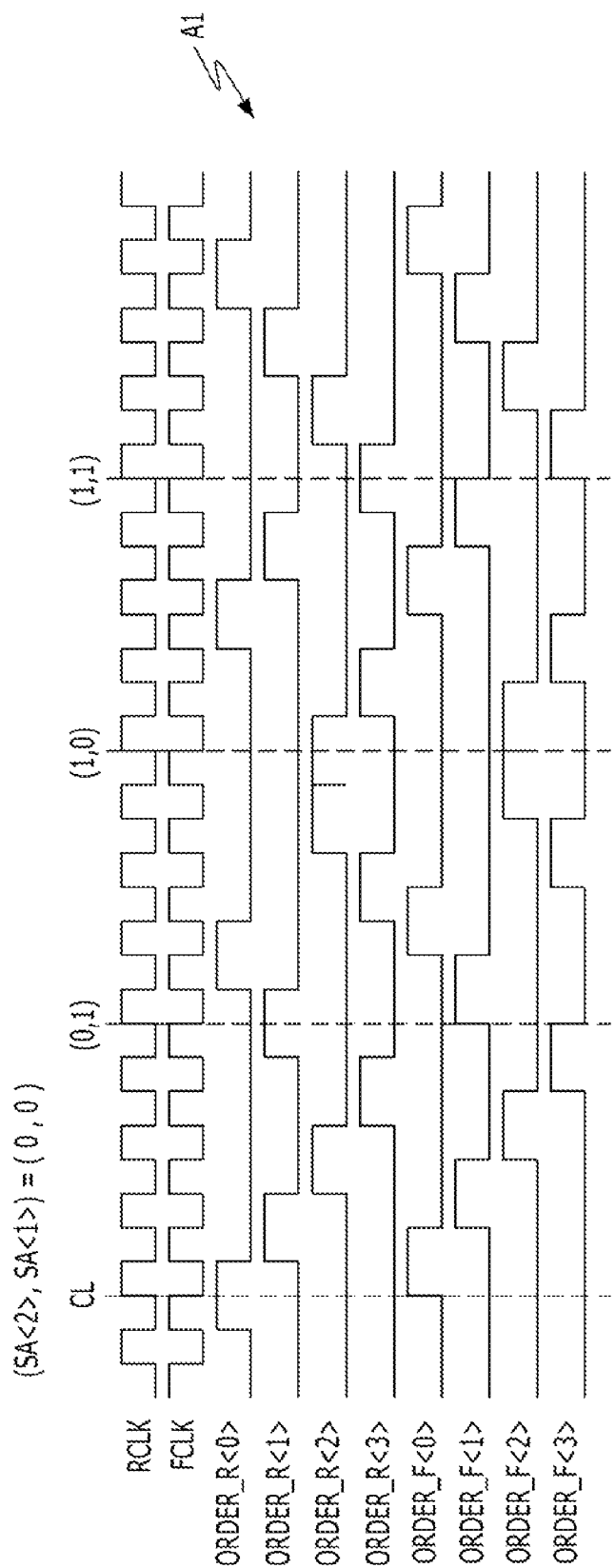

FIGS. 4C and 4D show the waveforms of the even control signals ORDER_R<0:3> and the odd control signals ORDER_F<©:37 according to the addresses SA<0:2> and the burst mode. CL represents a time when output of data through the data input/output pad DQ starts with lapse of a CAS latency (CL) after application of read command (only a 1st data output time is represented in the figures).

FIG. 4C shows the waveforms of the even control signals ORDER_R<0:3> and the odd control signals ORDER_F<0:3> according to the 2nd and 3rd addresses SA<1> and SA<2> without the case where the 1st address SA<0> is '1' in the sequential mode.

FIG. 4D shows the waveforms of the even control signals ORDER_R<0:3> and the odd control signals ORDER_F<0:3> according to the 2nd and 3rd addresses SA<1> and SA<2> in the case where the 1st address SA<0> is '1' in the sequential mode.

The even control signals ORDER_R<0:3> are activated in synchronization with the falling clock FCLK, and the odd control signals ORDER_F<0:3> are activated in synchronization with the rising clock RCLK, which is to secure the margin of one-half clock.

Figure 5:
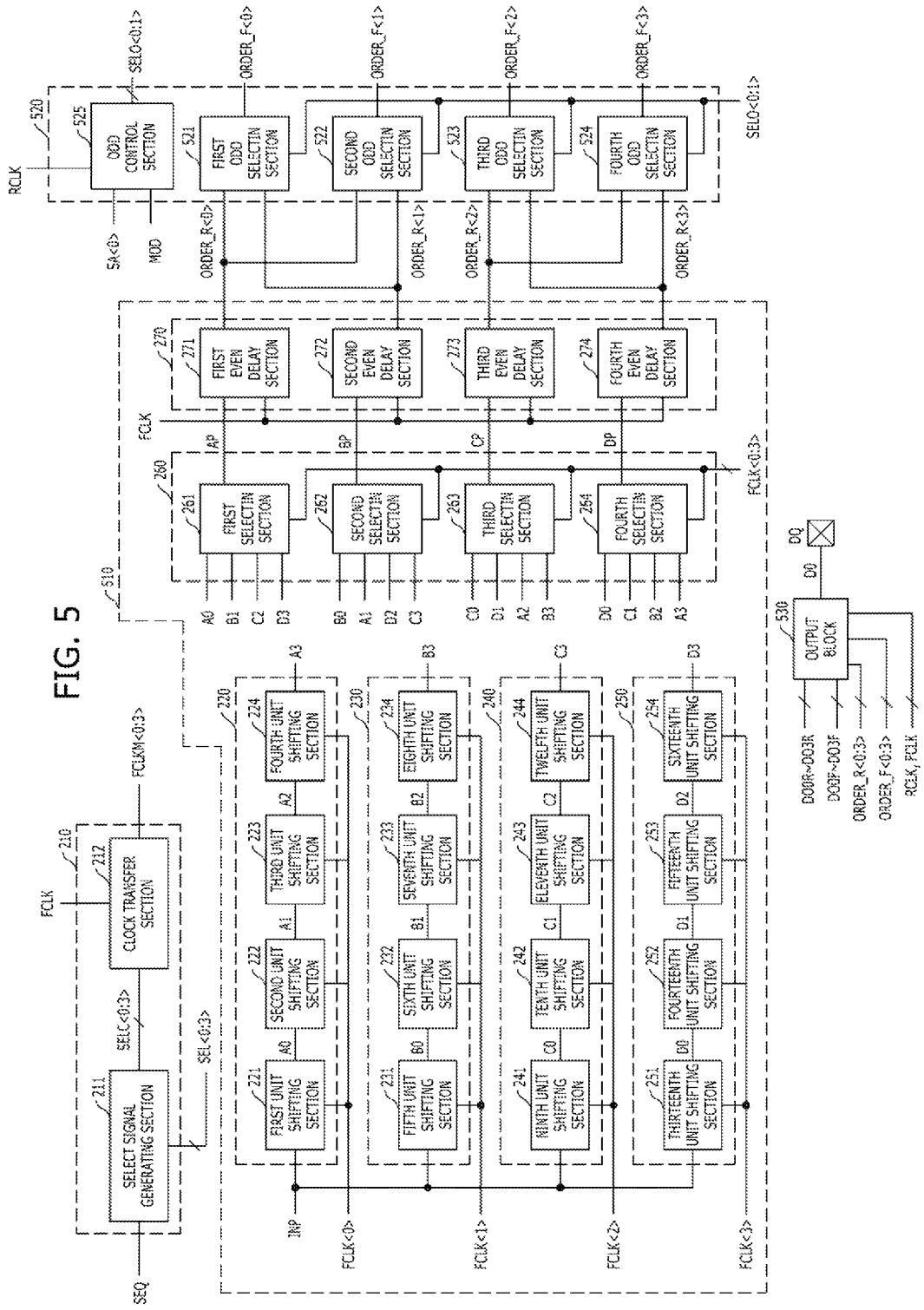
FIG. 5 is a configuration diagram illustrating a data output circuit in accordance with another embodiment of the present invention.

FIG. 5 is a configuration diagram of a data output circuit in accordance with another embodiment of the present invention. The data output circuit includes a burst order control circuit in accordance with the present invention. The burst order control circuit includes an even control signal generation block 510 and an odd control signal generation block 520. The even control signal generation block 510 includes the pulse generation circuit of FIG. 2.

Referring to FIG. 5, the data output circuit includes a plurality of data lines DO0R to DO3R and DO0F to DO3F, the even control signal generation block 510, the odd control signal generation block 520, and an output block 530. The even control signal generation block 510 includes a plurality of shifting units 220 to 250 each for generating one or more of output signals and sequentially activating the one or more of output signals when designated by one or more of address signals SA<0:2. The even control signal generation block 510 transfers the one or more of output signals of the shifting units designated by the one or more of address signals SA<0:2> among the plurality of shifting units 220 to 250, as one or more of even control signals ORDER_R<0:3>. The odd control signal generation block 520 transfers the one or more of even control signals ORDER_R<0:3> as one or more of odd control signals ORDER_F<0:3> according to correspondence relationships, which are determined by a mode signal MOD and the one or more of address signals SA<0:2>. The output block 530 aligns and outputs the data of the plurality of data lines DO0R to DO3R and DO0F to DO3F in response to the one or more of even control signals ORDER_R 0:3 and the one or more of odd control signals ORDER_F<0:3>.

The mode signal MOD determines a data output operation mode (a sequential mode or an interleave mode). The 1st to 3rd address signals SA<0:2> are acquired by controlling the phases of addresses applied from an outside of a semiconductor device with the data output circuit included therein, to generate signals used for data output.

The data output circuit of FIG. 5 outputs 8 data at a time through a data input/output pad DQ in the controlled order by the 1st to 3rd address signals SA<0:2> and the mode signal MOD. The data outputted from a core (not shown) of the semiconductor device are transferred to the even data lines DO0R to DO3R and the odd data lines DO0F to DO3F through a plurality of global lines (not shown). The data ('even data') of the even data lines DO0R to DO3R are transferred to an even line RDO in the controlled order according to the activation order of the even control signals ORDER_R<0:3>, and the data ('odd data') of the odd data lines DO0F to DO3F are transferred to an odd line FDO in the controlled order according to the activation order of the odd control signals ORDER_F<0:3, The data of the even line RDO and the odd line FDO are alternately outputted through the data input/output pad DQ. The even data are outputted in synchronization with a rising clock, and the odd data are outputted in synchronization with a falling clock.

The even control signal generation block 510 generates the even control signals ORDER_R<0:3> for determining times and a order at and in which the data of the even data lines DO0R to DO3R are transferred to the even line RDO, in response to the 2nd and 3rd address signals SA<1:2>. The even control signals ORDER_R<0:3> are activated in the controlled order according to the values of the 2nd and 3rd addresses SA<1:2>. The even control signal generation block 510 may include the pulse generation circuit of FIG. 2.

The even control signal generation block 510 includes an even control unit 210, 1st to 4th shifting units 220 to 250, an even signal transfer unit 260 and an even signal delay unit 270.

The even control unit 210 activates one or more of 1st to 4th control clocks FCLKM<0:3> and one or more of 1st to 4th select signals SEL<0:3> in response to the 2nd and 3rd address signals SA<1> and SA<2>.

The 1st to 4th shifting units 220 to 250 respectively generate respective 1st to 4th output signals A0 to A3, the 5th to 8th output signals B0 to B3, the 9th to 12th output signals C0 to C3, and the 13th to 16th output signals D0 to D3. When the respective 1st to 4th control clocks FCLKM<0:3> are activated, the respective 1st to 4th shifting units 220 to 250 sequentially activate respective 1st to 4th output signals A0 to A3, the 5th to 8th output signals B0 to B3, the 9th to 12th output signals C0 to C3, and the 13th to 16th output signals D0 to D3, by shifting the input pulse INP.

The even signal transfer unit 260 transfers the output signals of the shifting unit corresponding to the activated select signal among the 1st to 4th shifting units 220 to 250, as 1st to 4th preliminary even control signals AP to DP. The even signal delay unit 270 delays the 1st to 4th preliminary even control signals AP to DP and transfers them as the 1st to 4th even control signals ORDER_R<0:3>.

The even control signal generation block 510 includes the pulse generation circuit of FIG. 2, and the even signal delay unit 270. The even signal delay unit 270 delays (by a delay value of one clock) the 1st to 4th preliminary even control signals AP to DP and transfers them as the 1st to 4th even control signals ORDER_R<0:3> to conform the activation times of the 1st to 4th even control signals ORDER_R 0:3> to data output times.

The 2nd address signal SA<1> corresponds to the 1st sequence signal SEQ<1>, and the 3rd address signal SA<2> corresponds to the 2nd sequence signal SEQ<2>. The 1st to 4th preliminary even control signals AP to DP respectively correspond to the pulses AP to DP. The configuration and operations of the even control signal generation block 510 excluding the even signal delay unit 270 are the same as those described above with reference to FIG. 2. The even signal delay unit 270 includes 1st to 4th even delay sections 271 to 274. The 1st to 4th even delay sections 271 to 274 respectively delay the 1st to 4th preliminary even control signals AP to DP by one-half clock and transfer them as the 1st to 4th even control signals ORDER_R<0:3>.

The odd control signal generation block 520 transfers the 1st to 4th even control signals ORDER_R<0:3> as the 1st to 4th odd control signals ORDER_F<0:3> according to the correspondence relationships, which are determined by the mode signal MOD and the 1st address signal SA<0>. Since the output times of the even data and the odd data have an difference of one-half clock, the 1st to 4th even control signals ORDER_R<0:3> are delayed by one-half clock and are transferred as the 1st to 4th odd control signals ORDER_F<0:3>. In the case where the 1st address signal SA<0> is '1' and the mode signal MOD is '0' (sequential mode), the 1st to 3rd even control signals ORDER_R<0:3> are respectively transferred as the respective 2nd odd control signal ORDER_F<1>, the 1st odd control signal ORDER_F<0>, the 4th odd control signal ORDER_F<3>, and the 3rd odd control signal ORDER_F<2>. In the other cases, the 1st to 3rd even control signals ORDER_R<0:3> are respectively transferred as the respective 1st to 4th odd control signal ORDER_F<0:3>.

The odd control signal generation block 520 includes 1st to 4th odd selecting sections 521 to 524, and an odd control section 525.

The 1st odd selecting section 521 delays the 1st even control signal ORDER_R<0> and transfer it as the 1st or 2nd odd control signal ORDER_F<0> or ORDER_F<1>. The 2nd odd selecting section 522 delays the 2nd even control signal ORDER_R<1> and transfer it as the 1st or 2nd odd control signal ORDER_F<0> or ORDER_F<1>. The 3rd odd selecting section 523 delays the 3rd even control signal ORDER_R<2> and transfer it as the 3rd or 4th odd control signal ORDER_F<2> or ORDER_F<3>. The 4th odd selecting section 524 delays the 4th even control signal ORDER_R<3> and transfer it as the 3rd or 4th odd control signal ORDER_F<2> or ORDER_F<3>. The odd control section 525 controls the 1st to 4th odd selecting sections 521 to 524 to transfer the 1st to 4th even control signals ORDER_R 0:3> as the 1st to 4th odd control signals ORDER_F<0:3> according to the determined correspondence relationships in response to the mode signal MOD and the 1st address signal SA<0>.

The odd control section 525 activates a 1st odd select signal SELO<0> when the 1st address signal SA<0> is '1' and the mode signal MOD is '0' (sequential mode), and activates a 2nd odd select signal SELO<1> in the other cases. In the case where the 1st odd select signal SELO<g> is activated, the 1st to 4th odd selecting sections 521 to 524 respectively transfer the respective 1st to 4th even control signals ORDER_R<0:3> as the 2nd odd control signal ORDER_F<1> the 1st odd control signal ORDER_F<0>, the 4th odd control signal ORDER_F<3>, and the 3rd odd control signal ORDER_F<2> respectively. In the case where 2nd odd select signal SELO<1> is activated, the 1st to 4th odd selecting sections 521 to 524 respectively transfer the respective 1st to 4th even control signals ORDER_R<0:3> as the 1st to 4th odd control signals ORDER_F<0:3>.

The even control signal generation block 510 operates synchronization with a falling clock FCLK, and the odd control signal generation block 520 operates in synchronization with a rising clock RCLK, which has a logic value opposite to the falling clock FCLK.

Through the above operations, the burst order control circuit 510 and 520 generates the 1st to 4th even control signals ORDER_R<0:3> and the 1st to 4th odd control signals ORDER_F<0:3>. Similar to the pulse generation circuit of FIG. 2, since only one shifting unit among the 1st to 4th shifting units 220 to 250 included in the even control signal generation block 510 is activated, receives the control clock and performs the shifting operation, current and power consumption may be significantly reduced when compared to the conventional art.

The output block 530 outputs the data transferred from the plurality of global lines, through the data input/output pad DQ in the controlled order in response to the 1st to 4th even control signals ORDER_R<0:3> and the 1st to 4th odd control signals ORDER_F<0:3>. The configuration and operations of the output block 530 are the same as those of the data output block of FIG. 4A. Hereafter, the configuration and operations of the output block 530 will be described with reference to FIG. 4A.

The output block 530 includes a plurality of lines DO0R to DO3R, DO0F to DO3F, RDO, FDO and DO, an even transfer unit 410, an odd transfer unit 420, and an output transfer unit 430. The plurality of lines DO0R to DO3R, DO0F to DO3F, RDO, FDO and DO transfer to the data input/output pad DQ the data transferred through the plurality of global lines, stored in a plurality of pipe latches (not shown) and then outputted. The even transfer unit 410 transfers the data of the 1st even data line DO0R to the even transfer line RDO when the 1st even control signal ORDER_R<0> is activated; the data of the 2nd even data line DO1R to the even transfer line RDO when the 2nd even control signal ORDER_R<1> is activated; the data of the 3rd even data line DO2R to the even transfer line RDO when the 3rd even control signal ORDER_R<2> is activated; and the data of the 4th even data line DO3R to the even transfer line RDO when the 4th even control signal ORDER_R<3> is activated. The odd transfer unit 420 transfers the data of the 1st odd data line DO0F to the odd transfer line FDO when the 1st odd control signal ORDER_F<0> is activated; the data of the 2nd odd data line DO1F to the odd transfer line FDO when the 2nd odd control signal ORDER_F<1> is activated; the data of the 3rd odd data line DO2F to the odd transfer line FDO when the 3rd odd control signal ORDER_F<2> is activated; and the data of the 4th odd data line DO3F to the odd transfer line RDO when the 4th odd control signal ORDER_F<3> is activated. The output transfer unit 430 transfers the data of the even transfer line RDO to an output line DO in response to the rising clock. RCLK, and the data of the odd transfer line FDO to the output line DO in response to the falling clock FOLK.

Figure 6A:
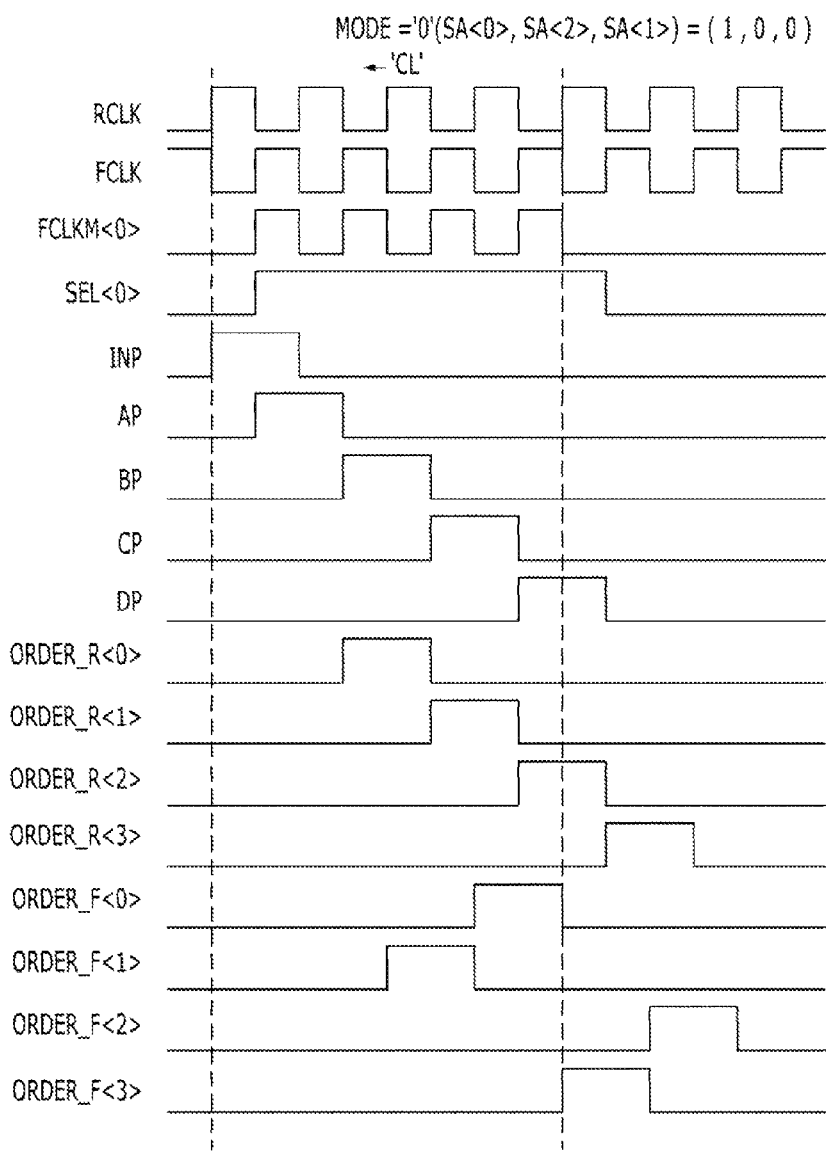

FIGS. 6A and 6B are waveform diagrams explaining operations of a burst order controller including the even control signal generation block 510 and the odd control signal generation block 520, corresponding to the burst order control circuit in accordance with another embodiment of the present invention, in the data output circuit shown in FIG. 5.

FIGS. 6A and 6B show waveform diagrams. CL represents a time when output of data through the data input/output pad DQ starts with lapse of a CAS latency (CL) after application of read command (only a 1st data output time is represented in the Figures).

FIG. 6A shows waveform diagrams of the case where the 1st to 3rd address signals SA<0:2> are (1, 0, 0) and it is the sequential mode (the mode signal MOD is '0').

In the even control signal generation block 510 the 1st control clock FCLKM<0> and the 1st select signal SEL<0> are activated, and the 1st shifting unit 220 shifts the input pulse INP and sequentially activates the output signals A0 to A3. In response to the activated 1st select signal SEL<0> the even signal transfer unit 260 transfers the 1st to 4th output signals A0 to A3 as the 1st to 4th preliminary even control signals AP to DP respectively. The even signal delay unit 270 delays the 1st to 4th preliminary even control signals AP to DP by one clock and transfers them as the 1st to 4th even control signals ORDER_R<0:3>.

In the odd control signal generation block 520, when the 2nd odd select signal SELO<> is activated, the 1st to 4th even control signals ORDER_R<0:3> are respectively delayed by one-half clock and transferred as the 2nd odd control signal ORDER_F<1>, ORDER_F<0>, the 4th odd control signal ORDER_F<3>, and the 3rd odd control signal ORDER_F<2>.

FIG. 6B shows waveform diagrams of the case where the 1st to 3rd address signals SA<0:2> are (0, 0, 1) and it is an interleave sequential mode (the mode signal MOD is '1').

In the even control signal generation block 510, the 2nd control clock FCLKM<1> and the 2nd select signal SEL<1> are activated, and the 2nd shifting unit 230 shifts the input pulse INP and sequentially activates the 5th to 8th output signals B0 to B3. In response to the activated 2nd select signal SEL<1>, the even signal transfer unit 260 transfers the 6th output signal B1 as the 1st preliminary even control signal AP; the 5th output signal B0 as the 2nd preliminary even control signal BP; the 8th output signal B3 as the 3rd preliminary even control signal CP; and the 7th output signal B2 as the 4th preliminary even control signal DP. The even signal delay unit 270 delays the 1st to 4th preliminary even control signals AP to DP by one clock and transfer them as the 1st to 4th even control signals ORDER_R<0:3>.

In the odd control signal generation block 520, when the 1st odd select signal SELO<1> is activated, the 1st to 4th even control signals ORDER_R<0:3 are delayed by one-half clock and are transferred as the 1st to 4th odd control signals ORDER_F<0:3>.

As described in connection with FIG. 6, the control clocks corresponding to shifting units not designated by the 2nd and 3rd address signals SA<1:2> among the 1st to 4th shifting units 220 to 250 of the burst order control circuit in the present embodiment are not activated. Therefore, since clocks are not provided to the shifting units not designated by the 2nd and 3rd addresses SA<1:2> among the 1st to 4th shifting units 220 to 250, current and power consumption may be reduced.

As is apparent from the above descriptions, the present invention may decrease the number of shifters simultaneously operating for the generation of a pulse, thereby reducing current and power consumption.

While the present invention has been described with respect to the specific embodiments, it will be apparent to those skilled in the art that various changes and modifications may be made without departing from the spirit and scope of the invention as defined in the following claims.

What is claimed is:

1. A pulse generation circuit comprising:
   a control unit configured to activate one or more of control docks among a plurality of control clocks, and to activate one or more of select signals among a plurality of select signals, in response to one or more of sequence signals;
   a plurality of shifting units each configured to generate one or more of output signals, and to sequentially activate the one or more of output signals by shifting an input pulse when a corresponding control clock among the plurality of control clocks is activated; and
   a signal transfer unit configured to transfer one or more of output signals of a shifting unit corresponding to an activated select signal among the plurality of shifting units, as one or more of pulses.

2. The pulse generation circuit of claim 1, wherein the shifting unit corresponding to the activated control clock also corresponds to the activated select signal.

3. The pulse generation circuit of claim 1, wherein each of shifting units corresponding to control docks not activated deactivates all of its one or more of output signals.

4. The pulse generation circuit of claim 1, wherein the signal transfer unit transfers the one or more of output signals of each of the plurality of shifting units, as the one or more of pulses according to preset correspondence relationships.

5. The pulse generation circuit of claim 1, wherein each of the shifting units comprises one or more of unit shifting sections connected in series and configured to output shifted inputs thereto in response to the activated control dock, and the one or more of output signals of each shifting unit correspond to outputs of the one or more of unit shifting sections.

6. The pulse generation circuit of claim 5, wherein the one or more of sequence signals comprise 1st and 2nd sequence signals, the plurality of control clocks comprise 1st to 4th control clocks, the plurality of select signals comprise 1st to 4th select signals, the plurality of shifting units comprise 1st to 4th shifting units, and the one or more of pulses comprise 1st to 4th pulses.

7. The pulse generation circuit of claim 6, wherein the 1st control clock and the 1st select signal correspond to the 1st shifting unit, the 2nd control clock and the 2nd select signal correspond to the 2nd shifting unit, the 3rd control clock and the 3rd select signal correspond to the 3rd shifting unit, and the 4th control clock and the 4th select signal correspond to the 4th shifting unit.

8. The pulse generation circuit of claim 7, wherein the one or more of output signals of the 1st shifting unit comprise 1st to 4th output signals, the one or more of output signals of the 2nd shifting unit comprise 5th to 8th output signals, the one or more of output signals of the 3rd shifting unit comprise 9th to 12th output signals, and the one or more of output signals of the 4th shifting unit comprise 13th to 16th output signals.

9. The pulse generation circuit of claim 8, wherein the signal transfer unit comprises:
   a 1st selecting section configured to select one of the 1st, the 6th, the 11th and the 16th output signals in response to activated one among the 1st to 4th select signals, and to transfer the selected signal as the 1st pulse;
   a 2nd selecting section configured to select one of the 2nd, the 5th, the 12th and the 15th output signals in response to activated one among the 1st to 4th select signals, and to transfer the selected signal as the 2nd pulse;
   a 3rd selecting section configured to select one of the 3rd, the 8th, the 9th and the 14th output signals in response to activated one among the 1st to 4th select signals, and to transfer the selected signal as the 3rd pulse; and
   a 4th selecting section configured to select one of the 4th, the 7th, the 10th and the 13th output signals in response to activated one among the 1st to 4th select signals, and to transfer the selected signal as the 4th pulse.

10. The pulse generation circuit of claim 9,
    wherein, the 1st to 4th selecting sections transfer the 1st to 4th output signals as the 1st to 4th pulses respectively when the 1st select signal is activated,
    the 1st to 4th selecting sections transfer the 6th, 5th, 8th, and 7th output signals as the 1st to 4th pulses respectively when the 2nd select signal is activated,
    the 1st to 4th selecting sections transfer the 11th, 12th, 9th, and 10th output signals as the 1st to 4th pulses respectively when the 3rd select signal is activated,
    the 1st to 4th selecting sections transfer the 16th 15th, 14th, and 13th output signals as the 1st to 4th pulses respectively when the 4th select signal is activated.

11. A pulse generation circuit comprising:
- a control unit configured to activate one of 1st and 2nd control docks and to activate one of a 1st and 2nd select signals in response to a sequence signal;
- a 1st shifting unit configured to generate 1st and 2nd output signals and to sequentially activate the 1st and 2nd output signals by shifting an input pulse when the 1st control clock is activated;
- a 2nd shifting unit configured to generate 3rd and 4th output signals and to sequentially activate the 3rd and 4th output signals by shifting the input pulse when the 2nd control clock is activated; and
- a signal transfer unit configured to transfer the 1st and 2nd output signals as each of 1st and 2nd pulse in response to the 1st select signal, and to transfer the 3rd and 4th output signals as each the 1st and 2nd pulse in response to the 2nd select signal.

12. The pulse generation circuit of claim 11,
wherein the 1st shifting unit includes 1st and 2nd unit shifting sections connected in series,
wherein the 2nd shifting unit includes 3rd and 4th unit shifting sections connected in series, and
wherein the 1st to 4th output signal are respectively outputs of the 1st to 4th unit shifting sections.

13. The pulse generation circuit of claim 11, wherein the 1st shifting unit deactivates the 1st and 2nd output signals when the 1st control dock is deactivated, and the 2nd shifting unit deactivates the 3rd and 4th output signals when the 2nd control dock is deactivated.

* * * * *